United States Patent
Weekamp et al.

(10) Patent No.: US 6,621,163 B2
(45) Date of Patent: Sep. 16, 2003

(54) ELECTRONIC DEVICE HAVING AN ELECTRONIC COMPONENT WITH A MULTI-LAYER COVER, AND METHOD

(75) Inventors: Johannus Wilhelmus Weekamp, Eindhoven (NL); Jorrit Jorritsma, Eindhoven (NL); Edwin Petrus Alois Maria Tijssen, Eindhoven (NL); Marc Andre De Samber, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/169,498

(22) PCT Filed: Nov. 6, 2001

(86) PCT No.: PCT/EP01/13022
§ 371 (c)(1),
(2), (4) Date: Jul. 3, 2002

(87) PCT Pub. No.: WO02/39583
PCT Pub. Date: May 16, 2002

(65) Prior Publication Data
US 2002/0190373 A1 Dec. 19, 2002

(30) Foreign Application Priority Data
Nov. 9, 2000 (EP) .............................................. 00203950

(51) Int. Cl.⁷ .................... H01L 23/48; H01L 23/52; H01L 29/40; B23K 35/24
(52) U.S. Cl. .................... 257/737; 257/704; 257/774; 257/775; 228/180.22
(58) Field of Search ........................ 257/704, 737, 257/774, 775, 693; 228/180.22

(56) References Cited

U.S. PATENT DOCUMENTS

| | | | | |
|---|---|---|---|---|
| 5,316,788 A | * | 5/1994 | Dibble et al. .................. | 427/98 |
| 5,912,510 A | * | 6/1999 | Hwang et al. .................. | 257/778 |
| RE37,082 E | * | 3/2001 | Butera .......................... | 257/678 |
| 6,326,244 B1 | * | 12/2001 | Brooks et al. ................ | 438/124 |
| 6,443,351 B1 | * | 9/2002 | Huang et al. ................. | 228/103 |
| 2002/0000649 A1 | * | 1/2002 | Tilmans et al. .............. | 257/678 |
| 2002/0017713 A1 | * | 2/2002 | Ruby et al. ................... | 257/704 |

FOREIGN PATENT DOCUMENTS

EP 0367181 4/1994 ............ H03H/9/02

* cited by examiner

Primary Examiner—Jasmine J B Clark
(74) Attorney, Agent, or Firm—Steven R. Biren

(57) ABSTRACT

An electronic device includes an electronic component 2, 3, such as a SAW (=Surface Acoustic Wave) filter 2, 3 having connection areas 4, 5. The filter 2, 3 is sealed off from the environment by means of a cover 6 forming a cavity 7 above the filter 2, 3. According to the invention, the cover 6 is formed by a lacquer layer 6A which is provided, at the location of the filter 2, 3, with an opening 7' and which is covered with a photoresist layer 6B closing the opening 7' such that the cavity 7 thus formed has a thickness above zero everywhere above the filter 2, 3. This enables an accurate and stable frequency selection by means of the filter 2, 3 and allows the device according to the invention to be very compact and easy to manufacture. Thus, the device according to the invention is very suitable for use in an application such as a mobile telephone, also after integration of the device with a semiconductor device. The photoresist layer 6B and the lacquer layer 6A preferably contain further openings 8, at the location of the connection regions 4, 5, which are provided with bumps 9, preferably solder bumps 9. Preferably, the photoresist layer 6B includes a solid foil 6B, which is solder-repellent.

10 Claims, 3 Drawing Sheets

ELECTRONIC DEVICE HAVING AN ELECTRONIC COMPONENT WITH A MULTI-LAYER COVER, AND METHOD

BACKGROUND OF THE INVENTION

The invention relates to an electronic device comprising a body including a substrate on which at least one electronic component is situated, which electronic component is connected to one or more connection areas and is sealed off from the environment by means of a cover on the component, which cover is provided on the substrate and forms a cavity above said component, said cover comprising a first body, which is situated on the substrate and which is provided, at the location of the component, with an opening, and said cover comprising a second body, which is situated on the first body and closes the opening. If the component comprises an acoustic wave filter, such a device is advantageously used in, inter alia, mobile telephones. The invention also includes a semiconductor device provided with such a device and a method of manufacturing such a device.

Such a device is disclosed in European patent 0.367.181, published on 20.04.1994. In said document, a description is given of an acoustic wave filter formed in and on a piezoelectric substrate of $LiTaO_3$. Said filter is sealed off from the environment by a cover provided on the substrate, which cover forms a cavity above the filter. As a result, the filter is protected against dust and other influences from the environment, such as attenuation, so that an accurate and stable frequency selection is possible. Said cover comprises, for example, a synthetic resin cap or a ring onto which a metal plate is secured.

A drawback of the known device resides in that it is not very compact and cannot be readily integrated in a semiconductor device.

Therefore, it is an object of the invention to provide a device that is compact and that can be readily integrated in a semiconductor device and that is also easy to manufacture.

To achieve this, a device as described in the opening paragraph is characterized in accordance with the invention in that the first body comprises a lacquer layer, and the second body comprises a photoresist layer, and the lateral dimensions of the opening as well as the thickness and the material of the second photoresist layer are chosen to be such that the thickness of the cavity is above zero throughout the surface of the component.

The invention is first of all based on the recognition that the use of (photo)resist layers enables the thickness of the cover to be very small, so that the device in accordance with the invention can be very compact as a result of, in particular, a small thickness and hence can particularly suitably be integrated on a semiconductor device that is used, for example, in a mobile telephone. In addition, the invention is based on the surprising recognition that a suitable choice of the thickness and the material of a photoresist layer enables, at predetermined lateral dimensions of the cavity to be formed, this cavity to be formed in a thickness above zero throughout the surface area of the component. This is very important, in particular, in connection with an accurate and stable frequency selection of an acoustic filter. The use of a photoresist for the uppermost layer of the cover additionally has the important advantage that this layer can be readily provided with further openings, by means of photolithography, at the location of the connection areas of the component. For this purpose, also the lacquer layer is provided, at the same locations, with a further opening.

Consequently, in an important embodiment, also the lacquer layer comprises a photoresist, and further openings are situated in the lacquer layer and in the photoresist layer at the location of the connection areas of the electronic component, in which openings contact bumps are situated on the connection areas. As a result, the device can be very readily integrated, namely by means of a surface mounting technique, with a semiconductor device which comprises, for example, a high-frequency circuit. Preferably, the contact bumps comprise a solder and, in connection therewith, the photoresist layer, and preferably also the lacquer layer, is a solder-repellent layer.

SUMMARY OF THE INVENTION

In a preferred embodiment, the lacquer layer and the photoresist layer comprise a solid foil. It has been found that such a foil can most suitably be used to satisfy the necessary requirements of the invention. Besides, such a foil can readily satisfy the requirement that it should be solder-repellent.

Preferably, the electronic component comprises a surface acoustic wave filter. On the one hand, the invention enables an accurate, stable frequency selection of such a filter, on the other hand, a compact integration of such a filter is very important to many applications, such as mobile telephony.

Therefore, the invention also comprises a semiconductor device which includes a semiconductor body with a substrate, and which is provided with one or more semiconductor elements provided with an electronic device in accordance with the invention.

The invention further comprises a method of manufacturing an electronic device comprising a body including a substrate on which at least one electronic component is formed, which electronic component is provided with one or more connection areas and is sealed off from the environment by providing the component with a cover on the substrate, a cavity being formed above the component, and said cover being formed by providing a first body on the substrate and providing said body with an opening at the location of the component, and by providing a second body on the first body, resulting in the opening being closed, which method is characterized in accordance with the invention in that the first body is formed by applying a lacquer layer on the substrate, and the second body is formed by applying a photoresist layer on top thereof, and the lateral dimensions of the opening, and the material and the thickness of the photoresist layer are chosen to be such that the thickness of the cavity is above zero throughout the surface area of the component.

Preferably, also for the lacquer layer use is made of a photoresist, and further openings are formed in the lacquer layer and in the photoresist layer at the location of the connection areas of the electronic component, in which openings contact bumps, preferably containing a solder, are formed on the connection areas. For the lacquer layer and for the photoresist layer use is preferably made of a solid foil, which is preferably solder-repellent. If for the electronic component use is made of a surface acoustic wave filter, a method in accordance with the invention enables an attractive device in accordance with the invention to be obtained in a very simple manner.

These and other aspects of the invention will be apparent from and elucidated with reference to the embodiment(s) described hereinafter.

BRIEF DESCRIPTION OF THE DRAWINGS

In the drawings.

The Figures are diagrammatic and not drawn to scale; particularly the dimensions in the thickness direction being exaggerated for clarity. Like reference numerals refer to like areas whenever possible.

DESCRIPTION OF THE PREFERRED EMBODIMENT

Figure 1:
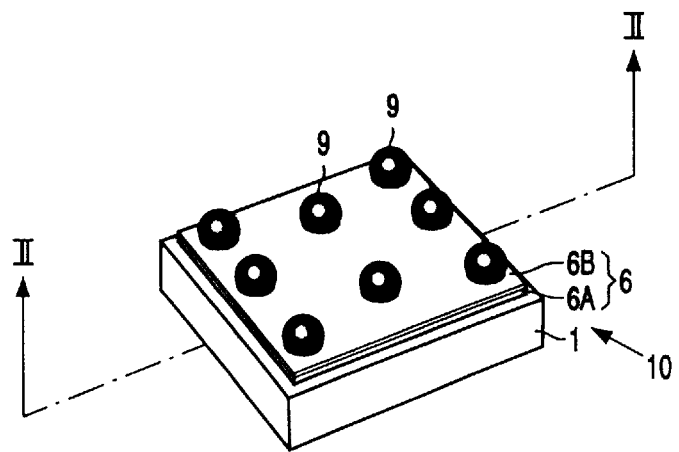
FIG. 1 is a diagrammatic, perspective view of an electronic device in accordance with the invention.
Figure 2:
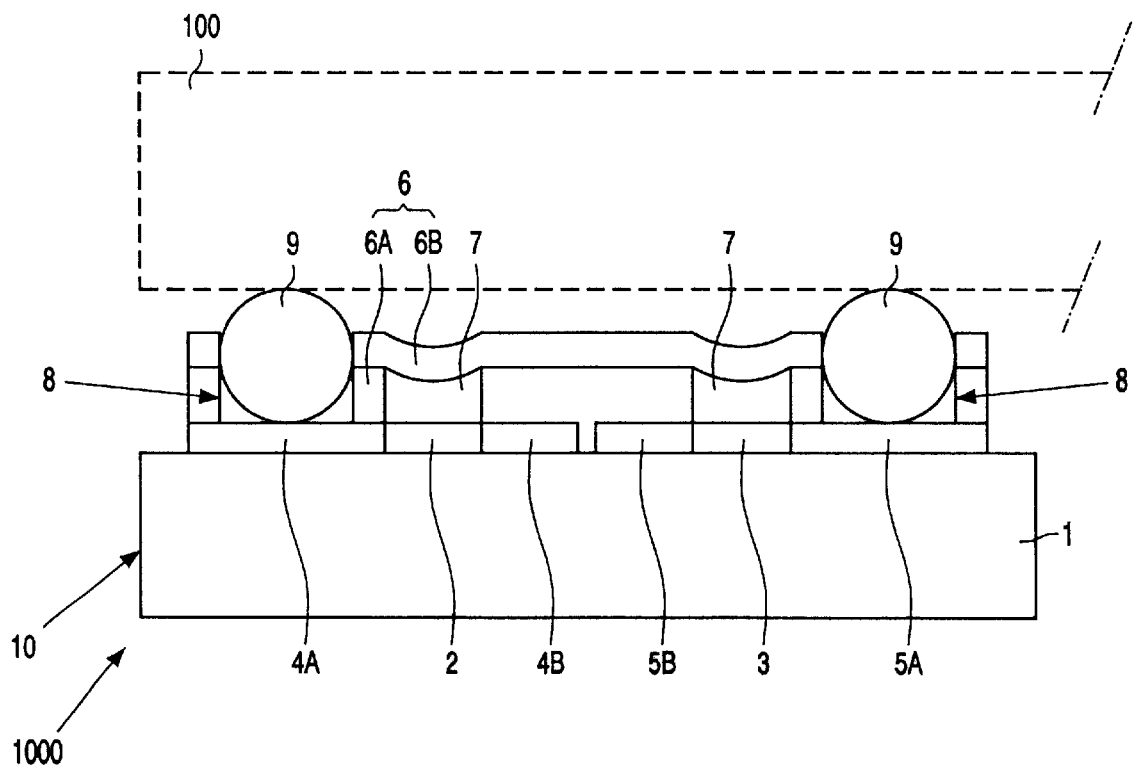
FIG. 2 is a diagrammatic, cross-sectional view, at right angles to the thickness direction, and taken on the line II—II, of the device shown in FIG. 1, and FIGS. 3 through 7 are diagrammatic, perspective views of the device shown in FIG. 1 in successive stages of the manufacturing process using a method in accordance with the invention.
Figure 3:
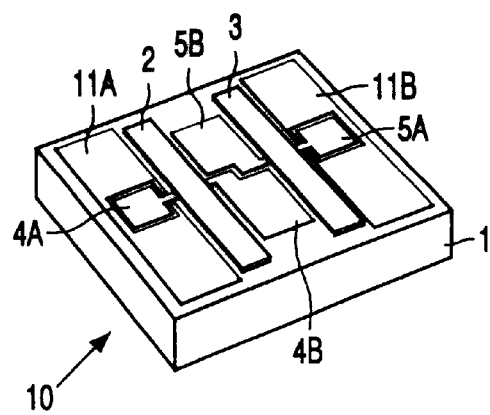
Figure 4:
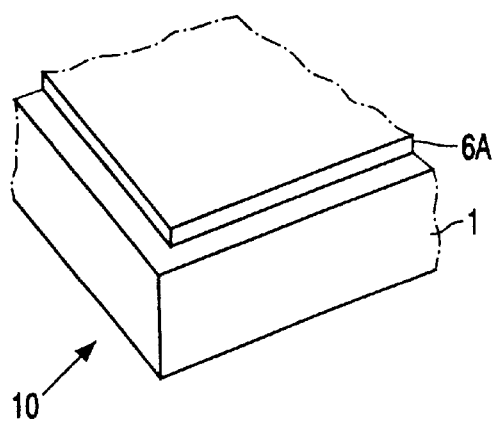
Figure 5:
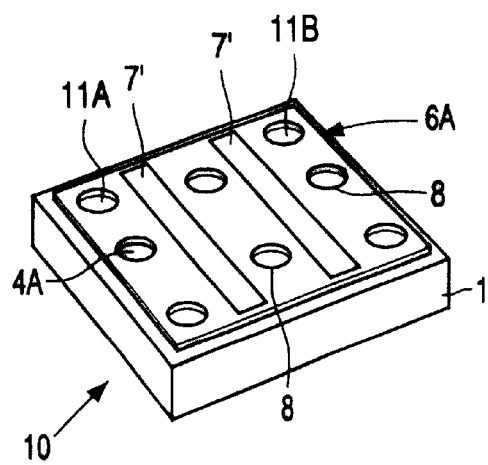
Figure 6:
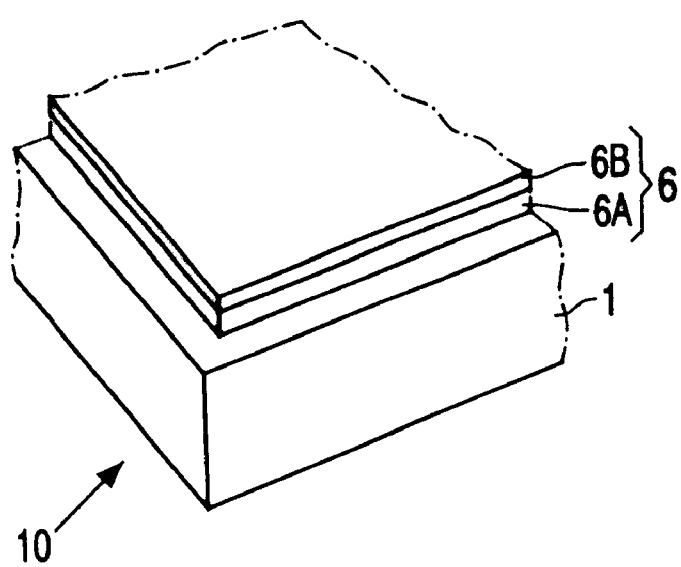
Figure 7:
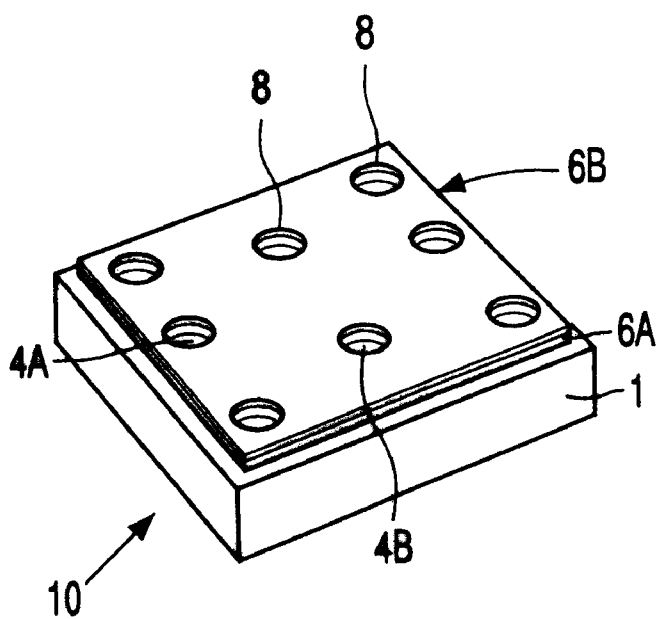

FIG. 1 is a diagrammatic, perspective view of an electronic device in accordance with the invention, and FIG. 2 is a diagrammatic, cross-sectional view, at right angles to the thickness direction and taken on the line II—II, of the device shown in FIG. 1. The device comprises a body 10 including a 0.5 mm thick substrate 1 which, in this case, is made of $LiTaO_3$. As shown in FIG. 2, a metal layer 2, 3, 4, 5 of aluminum is provided thereon in a thickness of 0.3 $\mu$m, said metal layer comprising the following parts: a first electronic component 2 which, in this case, includes two enmeshing comb-shaped conductor patterns, which are not separately shown in the Figures, said first electronic component and the substrate 1 jointly forming a first acoustic wave filter 2. The length and the width of the teeth of the filter are, respectively, 1 mm and ? $\mu$m, the spacing between the teeth is 2 $\mu$m, and the number of teeth is of the order of several hundred. The filter 2, i.e. the two comb-shaped portions thereof, is provided with two connection areas 4A, 4B. The metal layer 2, 3, 4, 5 additionally comprises a second filter 3, which resembles the first filter 2, but the comb structures thereof comprise a different, yet comparable, number of teeth, said second filter being provided with two further connection areas 5A, 5B. For more details regarding the structure and operation of these so-called SAW (=Surface Acoustic Wave) filters, reference is made to the magazine "Oki Technical Review", No. 158, vol. 63, April 1997. The filters 2, 3 are sealed off from the environment by means of a cover 6 which is provided on the substrate 1 so as to form a cavity 7 above the filters 2, 3, i.e. in this case two cavities 7. The cover 6 comprises a first body 6A, which is provided with an opening 7' at the location of the filters 2, 3, and a second body 6B, which closes the openings 7', is provided on said first body.

In accordance with the invention, the first body 6A comprises a lacquer layer 6A, and the second body 6B comprises a photoresist layer 6B, and the lateral dimensions of the opening 7' and the thickness and the material of the photoresist layer 6B are chosen to be such that the thickness of the cavity 7 is above zero throughout the surface of the component 2, 3. The use of a lacquer layer 6A and a photoresist layer 6B enables the thickness of the cover to be very small, so that the device in accordance with the invention is very compact and hence particularly suitable for integration on a semiconductor device for, for example, a mobile telephone. The invention is also based on the recognition that a suitable choice of the thickness and the material of the photoresist layer 6B in combination with a suitable choice of the lateral dimensions of the openings 7' in the lacquer layer 6A enables, at given dimensions of the component 2, 3, this component to be situated, throughout the surface, below a cavity 7 having a thickness which is larger than or equal to zero. By virtue thereof, an accurate and stable frequency selection by means of the filters 2, 3 is possible, which is very important for the intended applications. The use of a photoresist layer 6B for the second body 6B has the additional important advantage that this layer 6B can be readily provided with further openings 8, for example by means of photolithography, for example at the location of the connection areas 4, 5 of the filters 2, 3. It has been found that a suitable lacquer layer 6A is a layer 6A of Conformal 2523 having a thickness of approximately 58 $\mu$m. For the photoresist layer 6B use can advantageously be made of an approximately 32 $\mu$m thick layer 6B of Laminar 5032. By virtue thereof, deflection of the photoresist layer 6B, at the chosen dimensions of the filters 2, 3, i.e. a width of 1 mm and a length of several mm, is limited to less than 20% of the thickness of the lacquer layer 6A. It is to be noted that the most critical dimension as regards deflection is the smallest dimension of the filter 2, 3, i.e. in this case the width. The overall surface area of the device ranges from approximately 2×3 to 3×4 $mm^2$.

For the lacquer layer 6A use can also advantageously be made, like in this example, of a photoresist layer 6A, which enables the openings 7' and any further openings 8 to be readily formed therein. Said further openings 8 and the openings in the photoresist layer 6B can then be formed simultaneously. It is alternatively also possible to form the desired openings 7', 8 in the lacquer layer 6A when said lacquer layer is applied, for example by applying the lacquer layer 6A by means of a screen printing technique. In this example, the device also comprises ground connections 11A, 11B, which are provided at the location where a part of the further openings 8 is situated in the lacquer layer 6A and the photoresist layer 6B.

In a preferred embodiment of a device in accordance with the invention, both the lacquer layer 6A and the photoresist layer 6B are accordingly provided, at the location of the connection areas 4, 5 of the electronic component 2, 3, in this case the filters 2, 3, with further openings 8 wherein contact bumps 9 are situated on the connection areas 4, 5. By virtue thereof, the device in accordance with the invention can very suitably be used for so-called SMD (=Surface Mounted Device) mounting. Preferably, the photoresist layer 6B comprises a solder-repellent layer 6B. The same applies to the lacquer layer 6A. As a result, solder 9 can be readily used to form the contact bumps 9.

Preferably, the photoresist layer 6B comprises a solid foil layer 6B. The same applies to the lacquer layer 6A. Such foils 6A, 6B can be readily attached to the substrate 1 and to each other, and they have the desired properties, i.e. a small degree of deflection, solder repellency and photolithography processability. In this case, the invention is advantageously applied to an acoustic wave filter 2, 3. As a result, this filter can be readily integrated with a semiconductor device 100, resulting in a device 1000 which can very suitably be used for applications such as, for example, a mobile telephone. The device of this example is manufactured in the manner described hereinbelow using a method in accordance with the invention.

FIGS. 3 through 7 are diagrammatic, perspective views of the device shown in FIG. 1 in successive stages of the manufacturing process using a method in accordance with the invention. There is started from (see FIG. 3) a substrate 1 on which at least one electronic component 2, 3, in this case two SAW filters 2, 3, is formed which is provided with one or more connection areas 4, 5. The filters 2, 3 are sealed off from the environment by means of a cover 6 on the component 2, 3, which cover is provided on the substrate 1 so as to form a cavity 7 above the component 2, 3. This takes place (see FIG. 4) by providing a lacquer layer 6A which, in this case, comprises a solid foil-comprising photoresist 6A which extends over the substrate 1 provided with the component 2, 3. The lacquer layer 6A is subsequently (see FIG. 5) provided, using photolithography, with openings 7' and further openings 8 at the location of, respectively, the component 2, 3 and the connection areas 4, 5 thereof. Subsequently, (see FIG. 6) a photoresist layer 6B comprising a solid foil 6B is provided over the lacquer layer 6A, said photoresist layer 6B sealing off the openings 7', and the thickness of the cavities 7 formed being above zero.

Next, (see FIG. 7) further openings 8 corresponding to the further openings 8 in the lacquer layer 6A are formed in the photoresist layer 6B at the location of the connection areas 4, 5, 11. Finally, (see FIG. 1) contact bumps 9, in this case in the form of solder balls 9, are provided in the further openings 8, on the connection areas 4, 5, 11. The device in accordance with the invention can now be subjected to final assembly; for example, as diagrammatically shown in FIG. 2, it can be integrated with a semiconductor device 100 to form an electronic device 1000 which can suitably be used for mobile telephony. It will be clear that an important advantage of the invention resides in that it enables a large number of devices, only one of which is shown in the Figures, can be manufactured simultaneously.

The invention is not limited to the example described hereinabove, and within the scope of the invention many modifications and variations are possible to those skilled in the art. For example, components other than SAW filters can be used, for example MEMs (=Micro ElectroMechanical Systems) such as a miniature electric motor or a Reed contact. Consequently, it will be obvious that, in this application, an electronic component is to be taken to include also an electric, electromechanical, optoelectronic or semiconductor component.

It is further to be noted that the further openings in the lacquer layer and the further openings in the photoresist layer can also be formed simultaneously, or the further openings in the lacquer layer can also be formed after the further openings in the photoresist layer have been formed. In an important modification, a metal layer, such as a thin aluminum foil, is situated on or below the photoresist layer. As a result, a more sturdy cover and a better sealing of the component is obtained. Preferably, this metal layer is provided between the lacquer layer and the photoresist layer. This metal layer can then be used as a mask when openings are formed in the metal layer at the location of the further openings in the photoresist layer.

What is claimed is:

1. An electronic device comprising a body (10) including a substrate (1) on which at least one electronic component (2, 3) is situated, which electronic component is connected to one or more connection areas (4, 5) and is sealed off from the environment by means of a cover (6) on the component (2, 3), which cover is provided on the substrate (1) and forms a cavity (7) above said component (2, 3), said cover (6) comprising a first body (6A) which is situated on the substrate (1) and which is provided, at the location of the component (2, 3), with an opening (7'), and said cover comprising a second body (6B) which is situated on the first body (6A) and closes the opening (7'), characterized in that the first body comprises a lacquer layer (6A), and the second body comprises a photoresist layer (6B), and the lateral dimensions of the opening (7') as well as the thickness and the material of the photoresist layer (6B) are chosen to be such that the thickness of the cavity (7) is above zero throughout the surface of the component (2, 3).

2. A device as claimed in claim 1, characterized in that the lacquer layer (6A) also comprises a photoresist (6A), and further openings (8) are situated in the lacquer layer (6A) and in the photoresist layer (6B) at the location of the connection areas (4, 5) of the electronic component (2, 3), in which openings contact bumps (9) are situated on the connection areas (4, 5).

3. A device as claimed in claim 1, characterized in that the photoresist layer (6B) and, preferably, also the lacquer layer (6A) comprise a solder-repellent layer (6A, 6B).

4. A device as claimed in claim 1, characterized in that the lacquer layer (6A) and the photoresist layer (6B) comprise a solid foil (6A, 6B).

5. A device as claimed in claim 1, characterized in that the electronic component (2, 3) comprises a surface acoustic wave filter (2, 3).

6. A semiconductor device comprising a semiconductor body (100) with a substrate, and provided with one or more semiconductor elements, characterized in that the semiconductor device is provided with an electronic device as claimed in claim 1.

7. A method of manufacturing an electronic device comprising a body (10) including a substrate (1) on which at least one electronic component (2, 3) is formed, which electronic component is provided with one or more connection areas (4, 5) and is sealed off from the environment by providing the component (2, 3) with a cover (6) on the substrate (1), a cavity (7) being formed above the component (2, 3), said cover (6) being formed by providing a first body (6A) on the substrate (1) and providing said body with an opening (7') at the location of the component (2, 3), and by providing a second body (6B) on the first body (6A) in such a way that the opening (7') is closed, characterized in that the first body (6A) is formed by applying a lacquer layer (6A), and the second body (6B) is formed by applying a photoresist layer (6B) on top thereof, and the lateral dimensions of the opening (7') and the material used for the photoresist layer (6B) are chosen to be such that the thickness of the cavity (7) is above zero throughout the surface area of the component (2, 3).

8. A method as claimed in claim 7, characterized in that also for the lacquer layer (6A) use is made of a photoresist layer (6A), and further openings (8) are formed in the lacquer layer (6A) and in the photoresist layer (6B) at the location of the connection areas (4, 5) of the electronic component (2, 3), in which openings contact bumps (9) containing a solder are formed on the connection areas (4, 5).

9. A method as claimed in claim 7, characterized in that a solid foil comprising solder-repellent layers is used for the lacquer layer (6A) and the photoresist layer (6B).

10. A method as claimed in claim 7, characterized in that a surface acoustic wave filter (2, 3) is used as the electronic component (2, 3).

* * * * *